(12) United States Patent
In 'T Zandt et al.

(10) Patent No.: US 8,792,265 B2
(45) Date of Patent: Jul. 29, 2014

(54) PHASE CHANGE MATERIAL FOR A PHASE CHANGE MEMORY DEVICE AND METHOD FOR ADJUSTING THE RESISTIVITY OF THE MATERIAL

(75) Inventors: Michael Antoine Armand In 'T Zandt, Eindhoven (NL); Robertus Andrianus Maria Wolters, Eindhoven (NL); Hendrikus Jan Wondergem, Eindhoven (NL)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 382 days.

(21) Appl. No.: 13/266,291

(22) PCT Filed: Apr. 29, 2010

(86) PCT No.: PCT/IB2010/051891
§ 371 (c)(1),
(2), (4) Date: Nov. 17, 2011

(87) PCT Pub. No.: WO2010/125540
PCT Pub. Date: Nov. 4, 2010

(65) Prior Publication Data
US 2012/0091416 A1    Apr. 19, 2012

(30) Foreign Application Priority Data
Apr. 30, 2009    (EP) .................................. 09159237

(51) Int. Cl.
*G11C 11/21* (2006.01)
*H01B 1/02* (2006.01)
*H01L 21/64* (2006.01)

(52) U.S. Cl.
USPC ........ 365/148; 365/163; 252/519.15; 438/330

(58) Field of Classification Search
USPC ............... 365/148, 163; 252/519.15; 438/330
See application file for complete search history.

(56) References Cited

U.S. PATENT DOCUMENTS 5,254,382 A    10/1993    Ueno
2005/0202200 A1    9/2005    Ohno

FOREIGN PATENT DOCUMENTS

GB    2312083    10/1997
WO    2005093839    10/2005

OTHER PUBLICATIONS

International Search Report as published with WO 2010/125540 on Nov. 4, 2010.

*Primary Examiner* — Evan Pert
(74) *Attorney, Agent, or Firm* — McClure, Qualey & Rodack, LLP

(57) ABSTRACT

A phase change material for use in a phase change memory device comprises germanium-antimony-tellurium-indium, wherein the phase change material comprises in total more than 30 at % antimony, preferably 5-16 at % germanium, 30-60 at % antimony, 25-51 at % tellurium, and 2-33% at % indium.

11 Claims, 7 Drawing Sheets

US 8,792,265 B2

PHASE CHANGE MATERIAL FOR A PHASE CHANGE MEMORY DEVICE AND METHOD FOR ADJUSTING THE RESISTIVITY OF THE MATERIAL

CROSS-REFERENCE TO RELATED APPLICATION

This application is the 35 U.S.C. §371 national stage of PCT application "Phase Change Material for a Phase Change Memory Device and Method for Adjusting the Resistivity of the Material," having serial number PCT/IB2010/051891, filed on Apr. 29, 2010 which claims priority to and benefit of European Patent Application No. 09159237.8 filed on Apr. 30, 2009, both of which are incorporated by reference in their entirety.

FIELD OF THE INVENTION

The invention relates to a phase change material for use in a phase change memory device.

Further, the present invention relates to a method for adjusting a resistivity of a phase change material for use in a phase change memory device.

Further, the invention relates to a phase change memory device.

BACKGROUND OF THE INVENTION

A phase change memory device is used for data storing. The phase change memory device may switch between two states, namely a set state and a reset state. In the set state information is stored by the phase change memory device, whereas in the reset state the phase change memory device is cleared for a further storing of information.

For this purpose, the phase change memory device comprises a phase change material, e.g. a composition of a germanium-antimony-tellurium phase change material, which is bridged between two electrodes. One of the electrodes is electrically coupled to a switching element for switching the phase change memory device. The switching element is further connected to a current source. The second electrode is electrically connected to a current or voltage sensing device, which in turn is electrically connected to a ground potential.

Conventionally, the switching element is designed as a semiconductor transistor, e.g. a complementary metal-oxide-semiconductor transistor (CMOS).

Upon switching the transistor, a current is supplied to the electrode which is connected to the transistor. The induced current flows from the one electrode being connected to the transistor through the phase change material to the other electrode such that a heat induced change in the crystal structure of the phase change material occurs. Upon changing the crystal structure of the phase change material other physical properties of the phase change material, in particular the resistivity, also changes.

This change in the crystal structure of the phase change material represents a switch of the phase change memory device from the reset state to the set state or vice-versa. The phase change material thus reversibly undergoes a crystal structure change from the amorphous state to the crystalline state or vice versa. A change from the crystalline state to the amorphous state of the phase change material is caused by a "reset" current of a short duration and a high magnitude. A change from the amorphous state to the crystalline state of the phase change material is caused by a "set" current of a long duration and a low magnitude.

Upon reading the information stored by the phase change memory device, a small current is supplied to the one electrode being connected to the transistor such that the phase change material does not show a change in its crystal structure. The current or voltage sensing device detects the current flowing through the phase change material.

In order to switch the phase change memory device in a very efficient way, it is desirable that the available power provided by the transistor for the switching event will be deposited in the phase change material. When using a CMOS-transistor as the switching device, a relatively low power is available for the switching event, as the maximum current and voltage output of the transistor is lowered compared to a conventional semiconductor transistor. In turn, a high resistivity of the phase change material is desirable for compensating the transistor performance. Thus it is highly desirable to adjust the resistivity of the phase change material.

It is known from US 2008/0023686 A1 that physical properties such as the refractive index and the resistivity of a $Ge_2Sb_2Te_5$ phase change material can be modified by doping indium. Possible doped phase change materials may comprise a germanium concentration of about 10 at % to about 25 at %, an antimony concentration of about 15 at % to about 30 at %, a tellurium concentration of about 40 at % to about 70 at %, and an indium concentration of about 5 at % to about 15 at %.

However, only a small impact on the physical properties of the phase change material may be achieved by indium doping of the phase change material.

OBJECT AND SUMMARY OF THE INVENTION

Therefore, it may be an object of the invention to adjust a resistivity of a phase change material in an easy and efficient way.

In order to achieve the object defined above, a phase change material for use in a phase change memory device, a phase change memory device, and a method of adjusting a resistivity of a phase change material for use in a phase change memory device are provided.

According to an exemplary aspect of the invention, a phase change material for use in a phase change memory device is provided, wherein the phase change material comprises antimony-tellurium-indium, wherein the phase change material comprises in total more than 30 at % antimony.

According to a further exemplary aspect of the invention, a phase change memory device is provided, the phase change memory device comprising a first electrode, a second electrode, and a phase change material bridging the first and second electrodes.

According to a further exemplary aspect of the invention, a method of adjusting a resistivity of a phase change material for use in a phase change memory device is provided, wherein the phase change material comprises forming the phase change material which comprises antimony-tellurium-indium with in total more than 30 at % antimony.

The term "at %" may stand for "atom percent".

The term "phase change material" may particularly denote any material which may undergo a change in at least one physical property such as its long range ordering or crystal structure, its resistivity, refractive index and/or melting temperature. The change of the at least one physical property may be thermally induced. In particular, the change may be generated by ohmic losses of an electric current flowing through the phase change material and/or be generated by an electrically/a thermally coupled heating element, and/or be generated by the absorption of electromagnetic radiation. The phase change material may have not only two phases but also more than two phases, for instance crystalline, amorphous, meta-amorphous, meta-crystalline, crystalline with a different lattice orientation, etc.

The term "memory device" may particularly denote a physical structure comprising at least the first and second electrodes and the phase change material (such as a layer sequence, for instance monolithically integrated on/in a substrate such as a silicon substrate) which allows for storing information in an electronic manner. An amount of information stored in a memory cell may be 1 bit (particularly when the phase change material is switched between two phases representing logical values "1" or "0") or may be more than 1 bit (particularly when the phase change material is switched between at least three phases). The memory device may be formed on and/or in a substrate which may denote any suitable material, such as a semiconductor, glass, plastic, etc.

The memory device may be of a vertical type comprising vertically stacked components or of lateral type comprising laterally arranged components. These components may comprise the first and second electrodes and the phase change material. In particular, the phase change material may be designed as a stripe bridged between the first and second electrodes.

According to the exemplary aspects of the invention, a phase change material is provided whose resistivity may be adjusted or tuned by varying, in particular increasing, the amount of antimony. In particular, the phase change material may be an antimony rich compound comprising more than 30 at % antimony.

Increasing the amount of antimony in the phase change material may yield introducing a change in the crystal structure of the phase change material. This crystal structure change of the phase change material may comprise a change in the total crystal structure of the phase change material, a substitution of ions by antimony ions and/or an introduction of further crystal structure sections comprising at least antimony. These sections may form single ions at various lattice sites of the phase change material or may form layers of antimony arranged between further crystal structure sections formed by other compound elements. In particular, these sections may comprise antimony double layer stacks which may periodically recur in a unit cell of the phase change material.

The inventors found out that the resistivity of the phase change material may decrease upon increasing the amount of antimony in the phase change material. In particular, antimony double layers may be incorporated in the phase change material and/or the amount of antimony double layers may be increased in the phase change material. These antimony double layers may form paths of low resistivity through the crystal structure of the phase change material. In particular, the resistivity may be lower than the resistivity of antimony-tellurium compounds.

Further, the inventors found out that the crystallization temperature of the phase change material may increase upon increasing the amount of antimony in the phase change material.

Varying the amount of indium of the phase change material, in particular introducing indium into the crystal structure of a phase change material, may offer a further parameter for influencing the physical properties of the phase change material, in particular the resistivity and/or the crystallization temperature or the phase change material. In particular, indium-doped phase change materials may exhibit a higher resistivity and a higher crystallization temperature than phase change materials without indium. Indium may be incorporated into the crystal structure of the phase change material, in particular into the further antimony sections (e.g. double layers). Indium may substitute antimony in terms of being incorporated at lattice sites of antimony ions.

Thus a phase change material is provided which offers an easy, efficient and accurate way of adjusting the resistivity of the phase change material by changing the amount of antimony and/or indium.

Further, the phase change material offers a wide range of adjusting the physical properties of the phase change material, since the amount of antimony and/or indium may be varied over a broad range. Limits of the amount of antimony and/or indium incorporation into the crystal structure of the phase change material may be the crystallization time and/or temperature which may depend on the size of the unit cell of the phase change material.

Further, the physical properties of the phase change material may be tuned or adjusted in a cost-effective way, since antimony and/or indium may be an inexpensive material for manufacturing the phase change material.

For any method step or any process of manufacturing the phase change material and/or the phase change memory device, any conventional procedure as known from semiconductor technology may be implemented. In particular, such procedures may comprises using chemical vapour deposition (CVD), plasma-enhanced chemical vapour deposition (PECVD), atomic layer deposition (ALD), and sputtering techniques. Further, ion implanting of antimony and/or indium may be performed for changing the concentration of antimony and/or indium within the compounds. In particular, manufacturing procedures may comprise forming layers or components and/or removing layers or components using etching techniques such as wet etching, vapour etching, etc., as well as patterning techniques like optical lithography, UV lithography, electron beam lithography, etc.

Next, further exemplary embodiments of the phase change material will be explained. However, these embodiments also apply to the phase change memory device and the method of adjusting the resistivity of the phase change material for use in phase change memory device.

The phase change material may comprise in total more than 35 at % antimony. Phase change materials which are more antimony rich offer an improved performance of a phase change memory device comprising the phase change material.

The phase change material may comprise a base material which comprises $Sb_2Te_3$.

The term "base material" may particularly denote any kind of antimony-tellurium composition which may serve as base crystal structure in which the antimony and indium is to be incorporated. The base material may comprise further elements and/or compounds. In particular, the base material may comprise a stoichiometric one or a non-stoichiometric composition of antimony-tellurium.

$Sb_2Te_3$ may crystalline into the R-3m space group with a unit cell parameter of c equals to about 3.05 nm. The crystal structure may comprise Sb—Te 5-layer stacks or slabs of a sequence tellurium-antimony-tellurium-antimony-tellurium, into which the antimony and indium may be incorporated. Using this base material the phase change material may comprise in total more than approximately 40 at % antimony. The use of this conventional phase change material as the base material allow for using known experience in manufacturing the phase change material. The physical properties, in particular the resistivity and the crystallization temperature, of this base material are widely known and studied such that a change in the resistivity and/or crystallization temperature of the phase change material may be easily observed and thus tuned with respect to this base material.

The phase change material may comprise approximately 40 at % to approximately 67 at % antimony, approximately 22 at % to approximately 50% tellurium, and approximately 2 at % to approximately 38 at % indium, particularly approximately 50 at % to approximately 60 at % antimony, approximately 30 at % to approximately 40% tellurium, and approximately 10 at % to approximately 25 at % indium. These phase change materials represent a variety of compounds exhibiting different physical properties such as the resistivity and crystallization temperature. The crystal structure of these compounds may be different. A particular concentration of the elements of the phase change material may be chosen according to the desired physical properties of the phase change material. These two concentration ranges of antimony, tellurium, and indium are particularly useful when using a CMOS transistor as the switching element of the phase change memory device with the latter concentration range of antimony, tellurium, and indium providing a more improved phase change material.

The phase change material may comprise antimony-tellurium as a first base material and antimony-indium as a second base material, wherein the first base material and the second base material form a composition $(Sb_2Te_3)(Sb_{2-y}In_y)_x$ with values x and y being real numbers. The phase change material based on this chemical formula may be easily influenced by changing the values of x and y. The value x may stand for the amount of antimony sections, e.g. antimony double layer stacks, being introduced into the crystal structure of the phase change material. Further, the value x may be an integer number. The value y may represent the amount of indium introduced into the crystal structure of the phase change material. Assuming antimony being introduced into the crystal structure as antimony double layers $Sb_2$ and indium substituting antimony, indium may only be introduced up to the maximum amount of introduced antimony. The value y may be a real number.

The value x may be a number between about 0.5 and about 4.2 and the value y may be a number between about 0.35 and about 1.2, particularly the value x may be a number between about 1.2 and about 3 and the value y may be a number between about 0.5 and about 0.9. These values x and y may give limiting parameters for the phase change material based on the above given formula. The concentration ranges represented by these values x and y may be highly desirable in terms of the physical properties and the manufacturing process of these phase change materials. The phase change material using the latter number range of the value x and y may show improved physical properties in terms of a desired resistivity and crystallization temperature.

The phase change material may comprise a base material which may comprise germanium, whereby this base material offers using the Ge—Sb—Te phase change material line for forming the phase change material.

The base material may comprise Ge—$Sb_2Te_4$. The phase change material based on this base material may comprise in total more than approximately 29 at % antimony. Thus this kind of base material allows for forming an antimony rich phase change material. Further, the physical properties of the phase change material may also be tuned based on the amount of germanium in the phase change material. The crystal structure of phase change materials based on the base material Ge—$Sb_2Te_4$ may comprise 7-layer stacks of antimony, tellurium, and germanium with a sequence of tellurium-antimony-tellurium-germanium-tellurium-antimony-tellurium layers. Antimony and indium may be incorporated into the crystal structure of the base material such that further layers of antimony and indium may be formed between the base material layer stacks.

The phase change material may comprise approximately 5 at % to approximately 16 at % germanium, approximately 30 at % to approximately 60 at % at antimony, approximately 25 at % to approximately 51 at % tellurium, and approximately 2 at % to approximately 33 at % indium, particularly comprises approximately 8 at % to approximately 12 at % germanium, approximately 40 at % to approximately 50 at % at antimony, approximately 35 at % to approximately 45 at % tellurium, and approximately 10 at % to approximately 20 at % indium. These concentration ranges of antimony, germanium, tellurium and indium allow for various phase change materials such that the physical properties of such a phase change material can be tuned according to the desired physical properties of the phase change material to be used in the phase change memory device. The latter defined concentration range of germanium, antimony, tellurium and indium may yield improved physical properties of the phase change material such that the performance of a phase change memory device using such a phase change material may be significantly improved.

The phase change material may comprise germanium-antimony-tellurium as a first base material and antimony-indium as a second base material, wherein the first and second base materials form a composition $(Ge_zSb_2Te_4)(Sb_{2-y}In_y)_x$ with values x, y and z being real numbers. This chemical formula offers an easy access to phase change materials comprising the above-mentioned element concentrations.

The value x may be a number between about 0.5 and about 4.2, the value y may be a number between about 0.35 and about 1.2, and the value z may be a number between about 0.9 and about 1.1, particularly the value x may be a number between about 1.2 and about 3, the value y may be a number between about 0.5 and about 0.9, and the value z may be a number between about 0.95 and about 1.05. These parameters of x, y, and z offer various possibilities of forming phase change materials exhibiting different physical properties such that a particular physical property of the used phase change material may be easily and accurately tuned. These concentration ranges may be particularly useful when using a CMOS switching element for the phase change memory device. In particular, the physical properties of a phase change material based on the latter defined concentration ranges of germanium, antimony, tellurium, and indium may be further improved compared to a phase change material using the first defined concentration ranges of germanium, antimony, tellurium, and indium.

Respecting the method, forming the phase change material may comprise providing a base material which comprises antimony-tellurium, providing a further material which comprises antimony, and mixing the base material with the first material such that the phase change material comprises in total more than 30 at % antimony. The amount of antimony to be incorporated into the base material may be chosen according to a desired physical property of the phase change material.

The phase change memory device and the method for adjusting the resistivity of the phase change material for use in a phase change memory device may exhibit the same effects and advantages of the phase change material as defined above.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiments but to which the invention is not limited.

DESCRIPTION OF EMBODIMENTS

Figure 1:
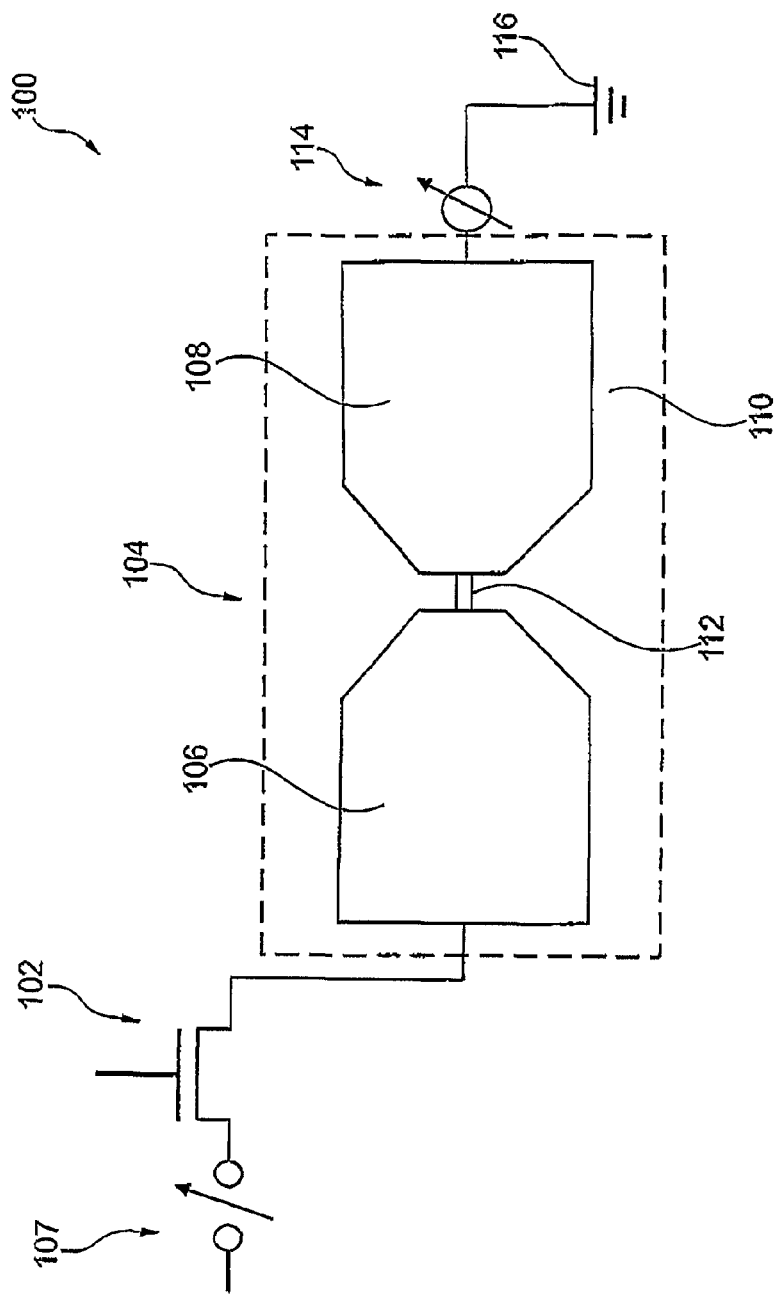
FIG. 1 shows a phase change memory device according to an exemplary embodiment of the invention.

The illustration in the drawings is schematical. In different drawings, similar or identical elements are provided with the same reference signs.

Referring to FIG. 1, a phase change memory device 100 is shown, which comprises a switching element 102 in the form of a transistor and a phase change cell 104. The switching element 102 is connected to a first electrode 106 of the phase change cell 104 via an electric conduct. The switching element 102 is further connected to a current source 107. The first electrode 106 and a second electrode 108 are formed on a substrate 110 of the phase change cell 104. A stripe of a phase change material 112 is bridged between the first and second electrodes 106, 108. A current measurement device 114 is electrically connected to the second electrode 108 and to a reference potential 116.

The material 112 of the phase change cell 104 can be switched by the switching element 102 supplying a current of different duration and magnitude to the first electrode 106. The current flows through the phase change material 112, whereby the phase change material 112 is heated such that its crystal structure changes.

In order to detect the present state of the phase change material 112, a small sensing current will be applied to the first electrode 106 and sensed by the current measurement device 114.

The resistivity of the phase change material 112 may be adjusted according to the need of the phase change memory device 100. This adjustment is based on changing the composition of the phase change material 112 in terms of changing the amount of an antimony and/or indium concentration.

Figure 2A:
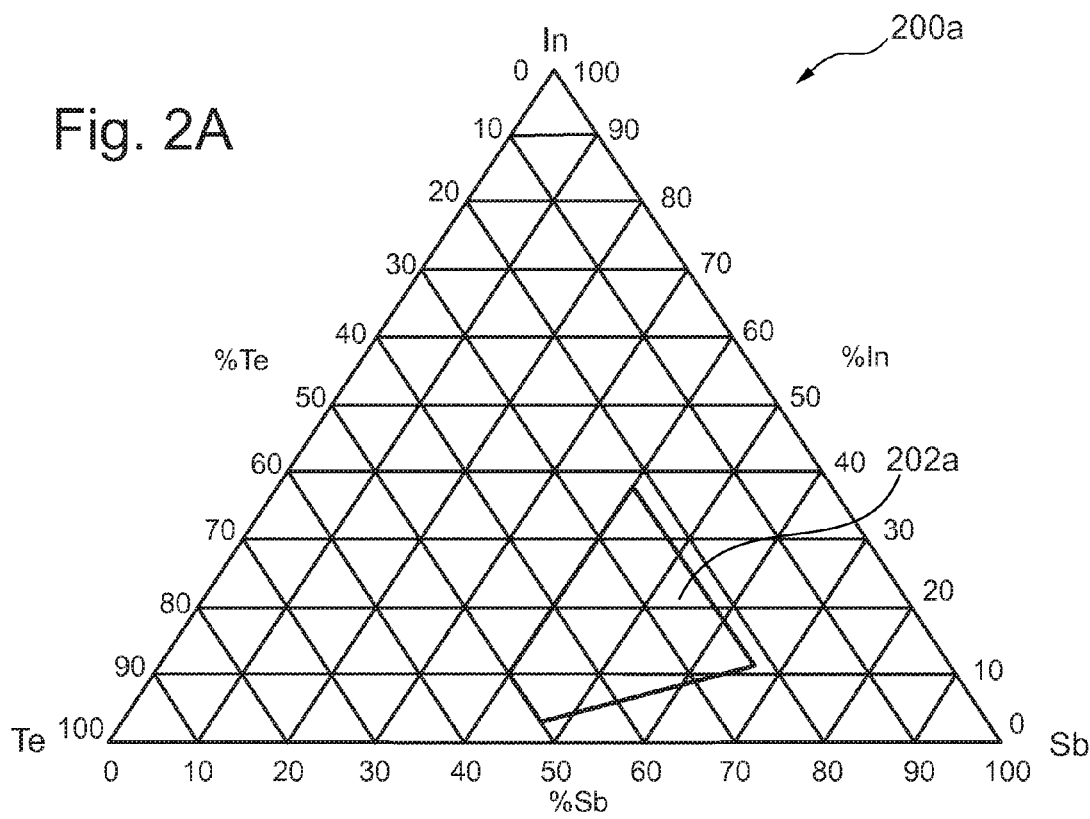
FIGS. 2A, B show phase diagrams of phase change materials according to exemplary embodiments of the invention.

FIG. 2A shows a phase diagram of an exemplary embodiment of an antimony-tellurium-indium phase change material 112 having the underlying chemical composition $(Sb_2Te_3)(Sb_{2-y}In_y)_x$. Desired compositions 202a of the phase change material 112 are formed using $0.5<x<4.2$ and $0.35<y<1.2$ and are represented in FIG. 2A as trapeze.

Figure 2B:
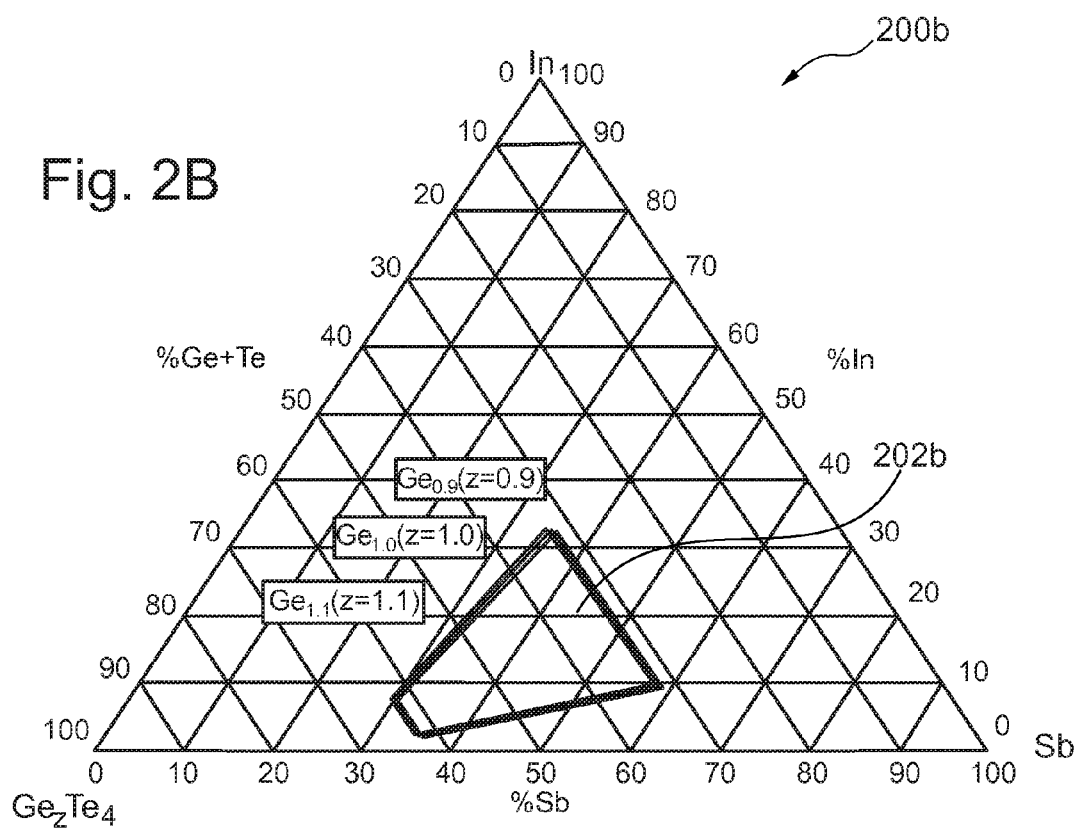
Figure 3A:
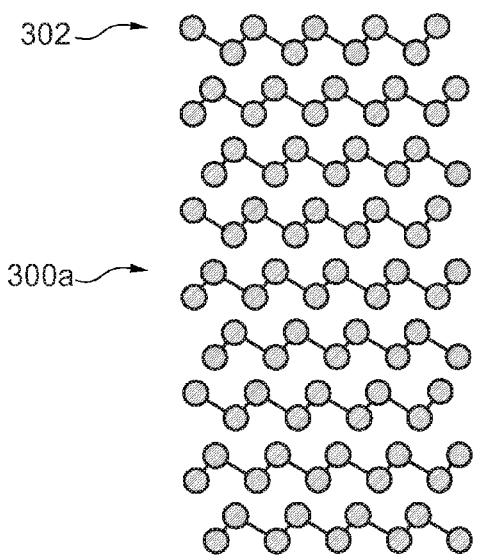
FIG. 3A-D show crystal structures of antimony-tellurium compounds.
Figure 3B:
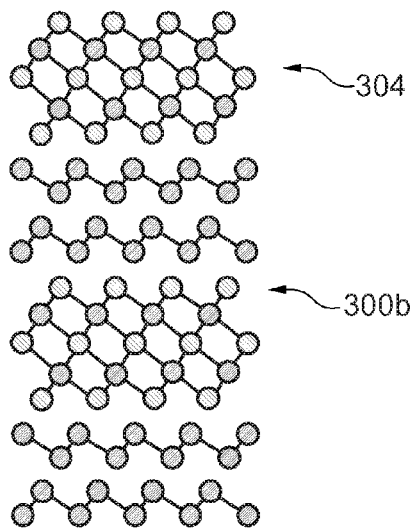
Figure 3C:
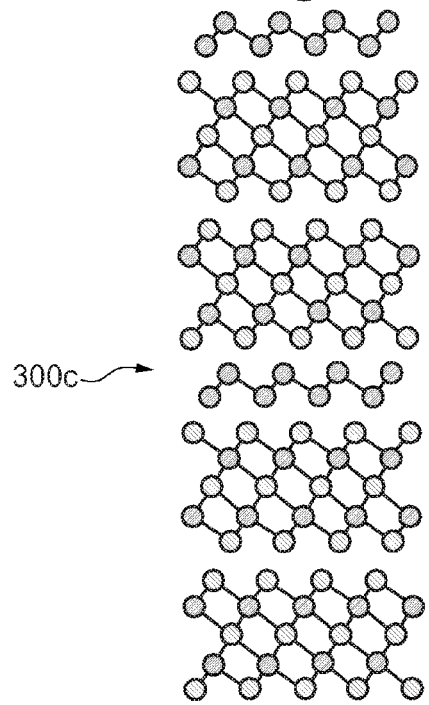
Figure 3D:
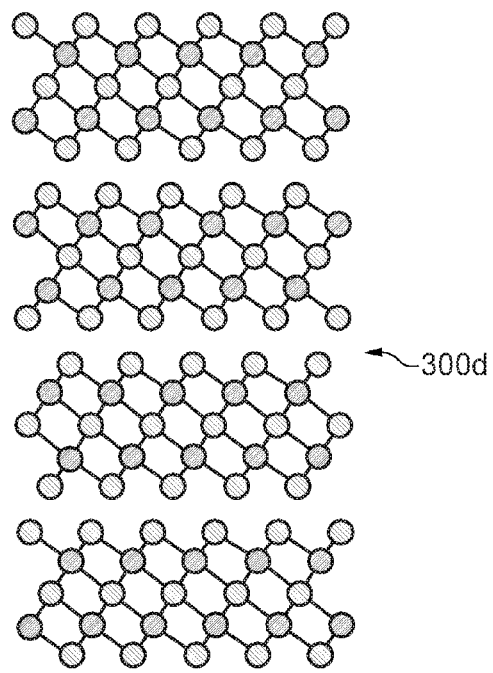

FIG. 2B shows a phase diagram 200b of a further exemplary embodiment of the phase change material 112 based on a germanium-antimony-tellurium-indium compound with the chemical formula $(Ge_zSb_2Te_4)(Sb_{2-y}In_y)_x$. Desired concentrations 202b of the phase change material 112 are given by $0.5<x<4.2$, $0.35<y<1.2$, and $0.9<z<1.1$. Different values z of desired compositions 202b of the phase change material 112 are represented by different trapezes in FIG. 2B.

These available concentration ranges of antimony, tellurium, germanium and indium of the above defined phase change materials 112 allow for a incorporation of sufficient antimony and indium into the crystal structure of a base material of $Sb_2Te_3$ and $Ge_zSb_2Te_4$, in order to accurately and easily adjust the resistivity and crystallization temperature of the phase change material 112.

In the following the effect of antimony and indium doping will be explained with respect to FIG. 3A-D and FIG. 4A-D.

FIG. 3A-D show crystal structures 300a-d of binary antimony-tellurium compounds comprising more than 40 at % antimony. These crystal structures 300a-d may elucidate basic elements of a crystal structure of antimony-(germanium)-tellurium-indium compounds of the phase change material 112.

A crystal structure 300a of $Sb_2$-antimony comprises a stack of double layers 302 yielding a space group R-3m (Pearson denomination hR6) with a unit cell lattice parameter of c=1.13 nm. A unit cell of the crystal structure 300b of $Sb_2Te$ having 66 at % antimony comprises stacks of two of the antimony double layer stacks 302 and one Sb—Te 5-layer stack 304 which are repeated once. This material crystallizes in the P-3m space group (Pearson denomination hP9) having a unit cell lattice parameter c=1.76 nm. A SbTe-compound comprises 50 at % antimony and shows a crystal structure 300c comprising a single double layer stack 302 between two 5-layer stacks 304. This compound crystallizes in the P-3m space group (Pearson denomination hP12) with a unit cell lattice parameter to be c=2.39 nm. A further antimony-tellurium compound crystallizes as $Sb_2Te_3$ (antimony concentration of 40 at %) in the space group R-3m (Pearson denomination hP15) with a unit cell lattice parameter to be c=3.05 nm. The crystal structure shows stacks of Sb—Te 5-layer stacks 304.

Depending on the crystallization process, e.g. the crystallization time and temperature, the phase change material may contain more than one crystalline phase.

These basic elements of antimony-tellurium compounds, namely the antimony double layer stacks 302 and the Sb—Te 5-layer stacks 304, may be used for explaining the physical properties of the phase change material in FIGS. 2A, B. It is assumed that the phase change materials 112 may also show crystal structures comprising these basic elements. As it is known from literature, $Sb_2Te_3$ exhibits a resistivity of 50 mΩ*cm, whereas the resistivity of $Sb_2$ is about 41 μΩ*cm. Thus the antimony double layers 302 may represent electrical conductive paths within the crystal structure of the phase change material 112 which may determine the total conductivity and thus the resistivity of the phase change material 112. Indium may represent a contamination of these antimony double layers such that the conductivity and therefore the resistivity of the phase change material may vary upon indium doping. However, indium may also substitute antimony of the base material of the phase change material 112 such that adjusting the desired physical properties of phase change material 112 is complex.

In the following, crystal structures of the phase change materials 112 are shown for different concentrations of the values x, y, and z. The crystal structures of these compounds comprise the above mentioned basic elements.

Figure 4A:
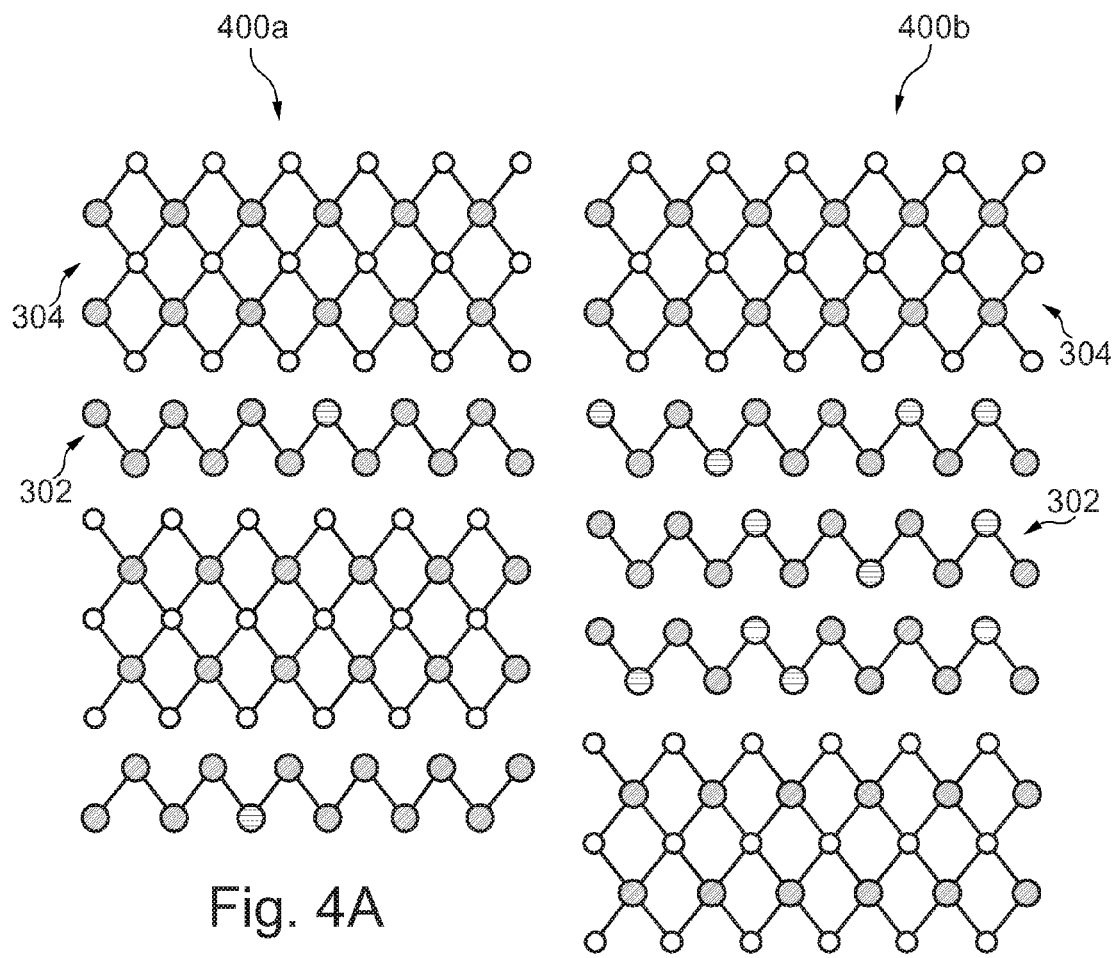
FIG. 4A-D show crystal structures of compounds of the phase change materials in FIGS. 2A, B.

Referring to FIG. 4A, a crystal structure 400a of $In_3Sb_{54}Te_{43}$ (x=1, y=0.2) is shown. The crystal structure 400a comprises a stack of one antimony double layer stack 302 and one Sb—Te 5-layer stack 302. Increasing the antimony content within an antimony-tellurium-compound of the formula $(Sb_2Te_3)(Sb_{2-y}In_y)_x$ yields introducing Sb-double layers 302 into the crystal structure of the compound. Further, indium ions preferably substitute antimony ions within the double layer stack 302.

Figure 4B:
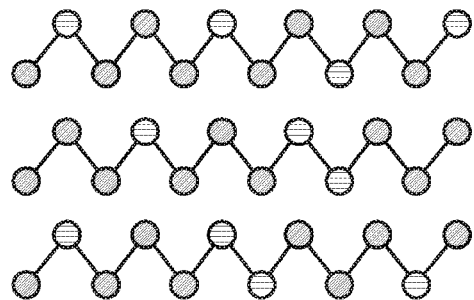

FIG. 4B shows a further example of an antimony-tellurium-indium compound, namely $In_{16}Sb_{57}Te_{27}$ (x=3, y=0.6). The crystal structure shows a periodic stack of three antimony double layers 302 comprising a small amount of indium and a 5-layer stack 304 of antimony-tellurium.

The germanium-antimony-tellurium-indium compound $Ge_9In_7Sb_{48}Te_{36}$ (x=2, y=0.4, z=1) shows a crystal structure 400c of two In—Sb double layer stacks 302 and a 7-layer stack 402 based on antimony, tellurium, and germanium.

Figures 4C, 4D:
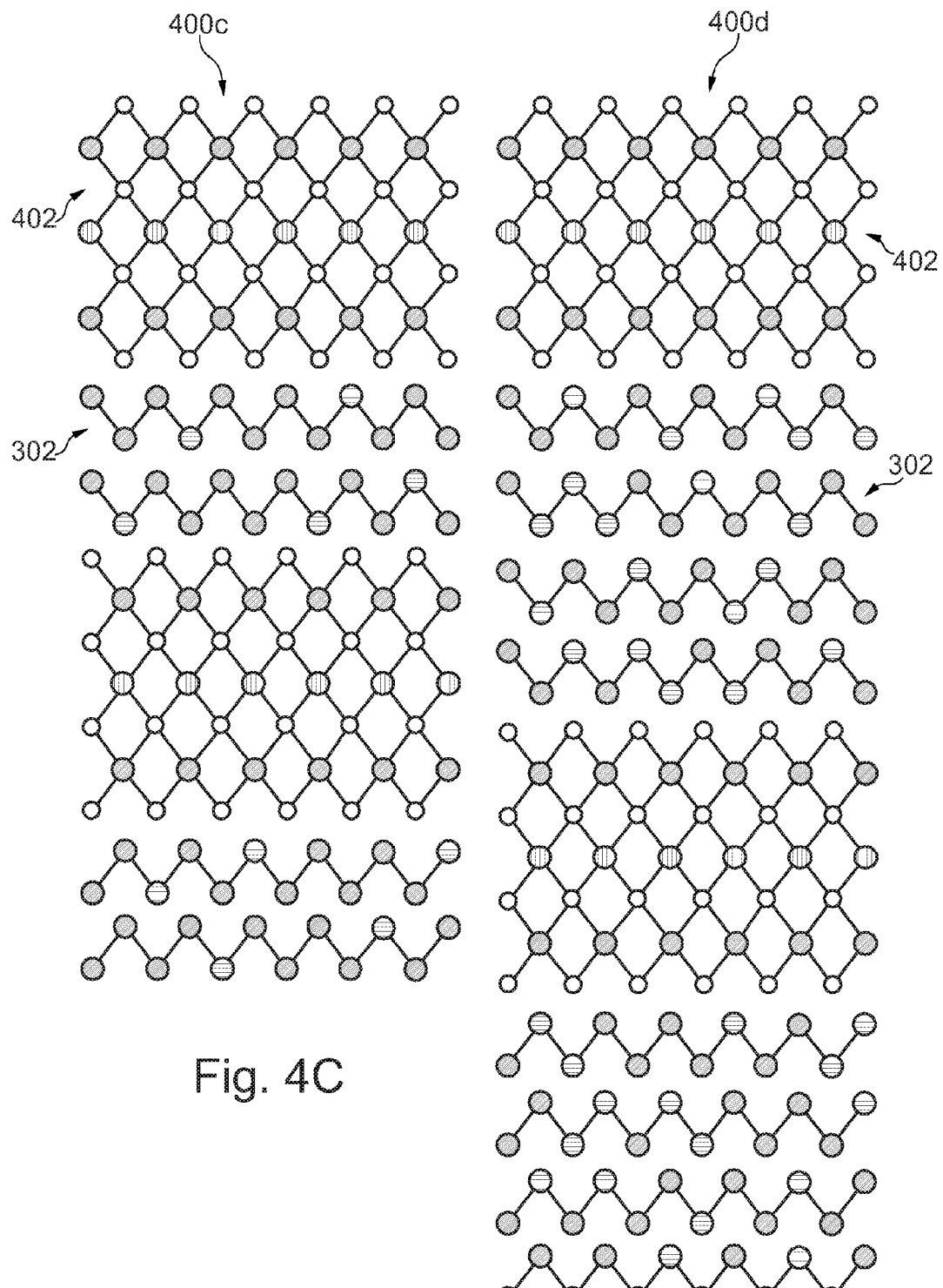

Referring to FIG. 4D, a crystal structure 400d of $Ge_7In_{21}Sb_{45}Te_{27}$ is shown. The crystal structure 400d consists of four double layer stacks 302 comprising antimony and indium and one 7-layer stack 402 of antimony-tellurium-germanium.

For the sake of clarity, the double layer stacks 302, the 5-layer stacks 304 and the 7-layer stacks 402 are shown in a plane view. Further, indium ions are shown to only be present in the antimony double layer stacks 302 despite of indium eventually substituting antimony of the 5-layer stacks 304 or 7-layer stacks 402.

Figure 5A:
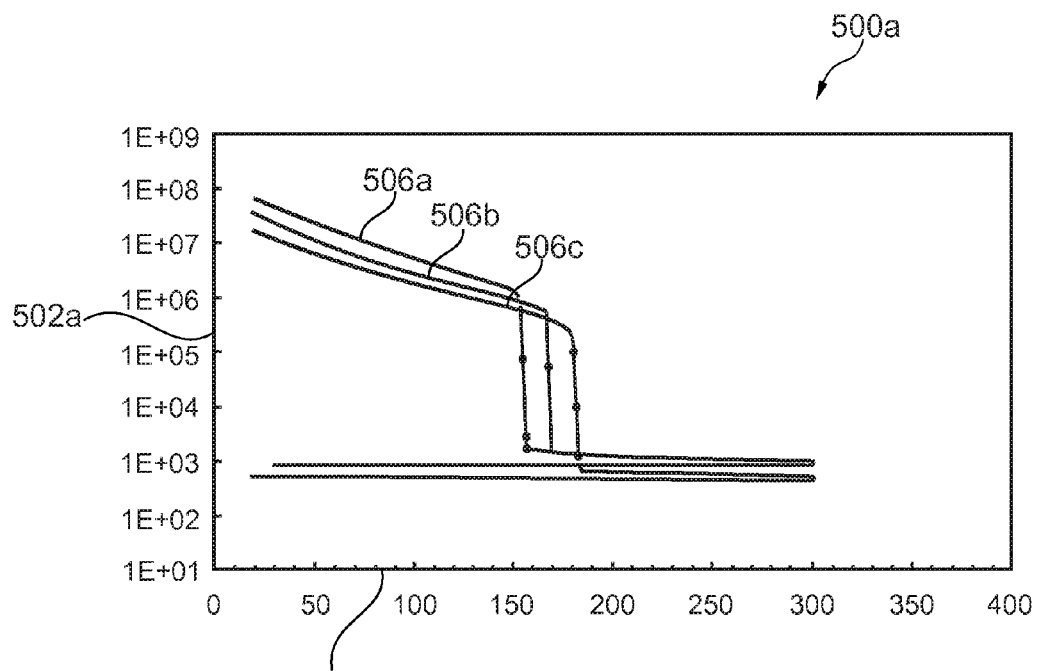
FIGS. 5A, B show diagrams of a temperature dependency of a resistivity of compounds of the phase change materials in FIG. 2A.

FIGS. 5A, B shows crystallization diagrams 500a, b depicting a temperature dependency of a resistivity of further antimony-tellurium-indium compounds of the phase change material 112. Ordinate 502a, b and abscissa 504a, b of the diagrams 500a, b represent a resistivity ($\mu\Omega$*cm) and a temperature (° C.), respectively. The antimony-tellurium-indium compounds are investigates in the crystalline phase after an anneal process at 300° C. for 1 h.

In FIG. 5A resistivity curves 506a-c of $In_3Sb_{54}Te_{43}$, $In_5Sb_{62}Te_{33}$, and $In_6Sb_{67}Te_{27}$ decreases upon increasing the amount of antimony, in particular the amount of antimony double layers 302 (value x). For instance, the resistivity at 20° C. of these compounds is approximately 842 $\mu\Omega$*cm, 559 $\mu\Omega$*cm, and 516 $\mu\Omega$*cm. The corresponding crystallization temperatures $T_c$ of these compounds are about 155° C., 169° C., and 182° C. Thus an increase in the antimony content of the phase change material 112 leads to an increase in the crystallization temperature $T_c$.

Figure 5B:
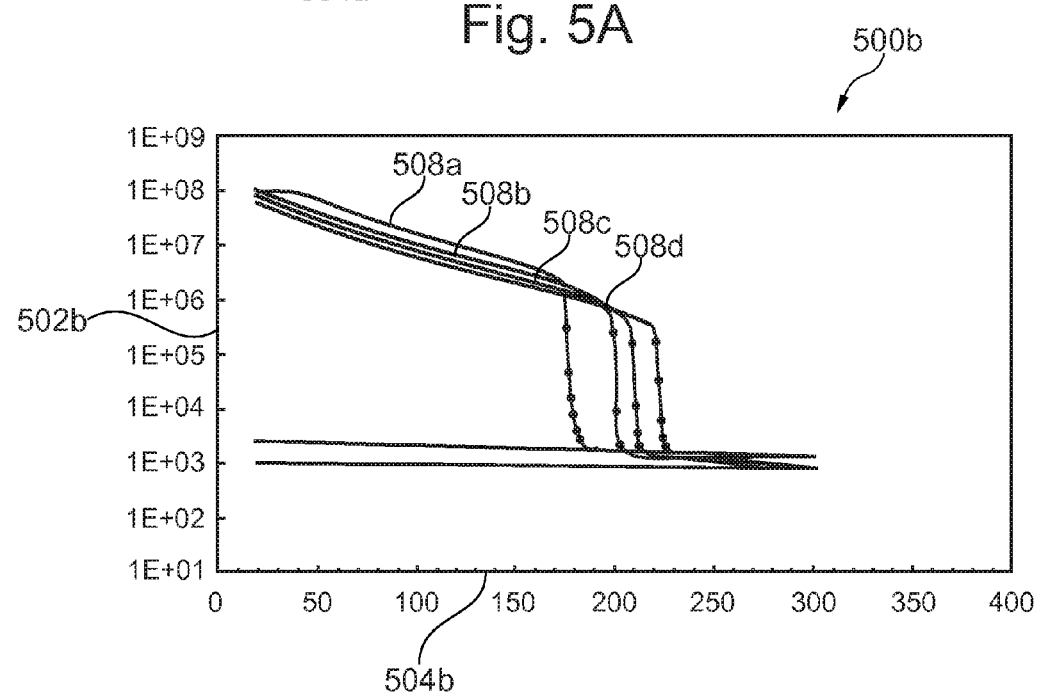

FIG. 5B shows the crystallization diagram 500b of further antimony-tellurium-indium compounds of the phase change material 112. Again, the resistivity 308a-d of $In_8Sb_{49}Te_{43}$, $In_{13}Sb_{54}Te_{33}$, $In_{16}Sb_{57}Te_{27}$, and $In_{19}Sb_{58}Te_{23}$ decreases upon increasing the amount of antimony double layers (x) with the resistivity at 20° C. being approximately 2350 $\mu\Omega$*cm, 1140 $\mu\Omega$*cm, 1040 $\mu\Omega$*cm and 957 $\mu\Omega$*cm. The crystallization temperatures $T_c$ of these compounds are approximately 177° C., 200° C., 210° C., and 222° C.

In the following, an overview over the dependency of the resistivity of the crystallization temperature of the phase change material 112 on the values x and y is presented.

Figure 6A:
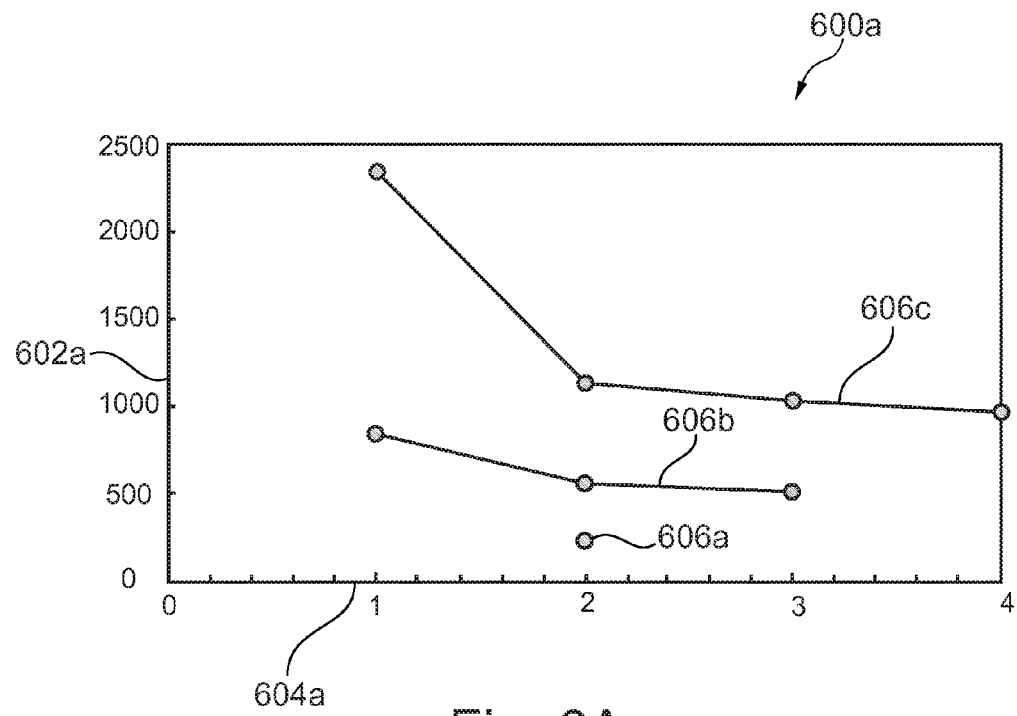
FIGS. 6A, B show diagrams of an antimony dependency of a resistivity and crystallization temperature of compounds of the phase change materials in FIG. 2A.

Referring to FIG. 6A, a diagram 600a shows the dependency of resistivity on the amount of double layers x for different values of y. An ordinate 602 of the diagram 600a corresponds to the resistivity in $\mu\Omega$*cm, whereas an abscissa 604a corresponds to the amount of double layers x in arbitrary units. For a given value y resistivity curves 606a-c corresponding to y values of 0, 0.2, and 0.6 decreases upon increasing the amount of double layers x. Increasing the amount of indium, i.e. increasing the value y, leads to an increase in the resistivity of the phase change material 112.

Figure 6B:
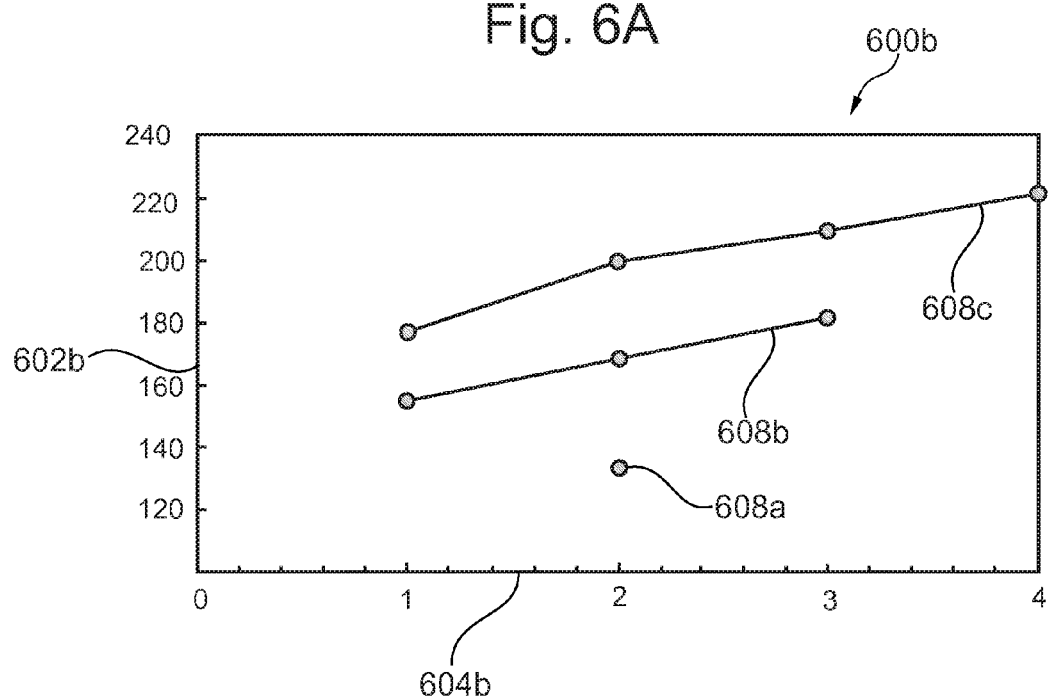

Referring to FIG. 6B, a diagram 600b of the crystallization temperature $T_c$ (ordinate 602b in units of ° C.) depending on the amount of antimony double layers (value x in arbitrary units) is shown. The crystallization temperature $T_c$ is plotted for different values of y, namely y=0, 0.2, and 0.6, leading to curves 608a-c. Upon increasing the amount of double layers x, the crystallization temperature $T_c$ increases. Further, increasing the amount of indium in terms of increasing the value y the crystallization temperature also increases. This effect is highly desirable, since a high crystallization temperature $T_c$ is related to a good retention of the phase change material 112.

Changing both the amount of antimony and indium in an antimony-tellurium-indium and in an antimony-tellurium-indium-germanium compound yields the desired resistivity and crystallization temperature.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A phase change material for use in a phase change memory device, wherein the phase change material comprises antimony-tellurium-indium, wherein the phase change material comprises in total more than 30 at % antimony, wherein the phase change material comprises a base material which comprises germanium and $Sb_2Te_3$.

2. The material of claim 1, wherein the phase change material comprises in total more than 35 at % antimony.

3. The material of claim 1, wherein the phase change material comprises 40 at % to 67 at % antimony, 22 at % to 50 at % tellurium and 2 at % to 38 at % indium, particularly comprises 50 at % to 60 at % antimony, 30 at % to 40 at % tellurium and 10 at % to 25 at % indium.

4. The material of claim 1, wherein the phase change material comprises antimony-tellurium as a first base material and antimony-indium as a second base material, wherein the first base material and the second base material form a composition $(Sb_2Te_3)(Sb_2\text{-}yIn_y)_x$ with values x and y being real numbers.

5. The material of claim 4, wherein the value x is a number between 0.5 and 4.2 and wherein the value y is a number between 0.35 and 1.2, wherein particularly the value x is a number between 1.2 and 3 and wherein the value y is a number between 0.5 and 0.9.

6. The material of claim 1, wherein the phase change material comprises a base material which comprises Ge—$Sb_2Te_4$.

7. The material of claim 1, wherein the phase change material comprises 5 at % to 16 at % germanium, 30 at % to 60 at % antimony, 25 at % to 51 at % tellurium, and 2 at % to 33 at % indium, particularly comprises 8 at % to 12 at % germanium, 40 at % to 50 at % antimony, 35 at % to 45 at % tellurium, and 10 at % to 20 at % indium.

8. The material of claim 1, wherein the phase change material comprises germanium-antimony-tellurium as a first base material and antimony-indium as a second base material, wherein the first base material and the second base material form a composition $(Ge_zSb_2Te_4)(Sb_{2-y}In_y)_x$ with values x, y and z being real numbers.

9. The material of claim 8, wherein the value x is a number between 0.5 and 4.2, wherein the value y is a number between 0.35 and 1.2, and wherein the value z is a number between 0.9 and 1.1, wherein particularly the value x is a number between 1.2 and 3, wherein the value y is a number between 0.5 and 0.9, and wherein the value z is a number between 0.95 and 1.05.

10. A phase change memory device, comprising a first electrode, a second electrode, and a phase change material according to any one of claims 1 to 8 bridging the first and second electrodes.

11. A method of adjusting a resistivity of a phase change material for use in a phase change memory device, wherein the method comprises forming the phase change material which comprises antimony-tellurium-indium with in total more than 30 at % antimony, wherein the phase change material comprises a base material which comprises germanium,
   wherein forming the phase change material comprises providing a base material which comprises antimony-tellurium, providing a further material which comprises antimony, and mixing the base material with the further material such that the phase change material comprises in total more than 30 at % antimony.

\* \* \* \* \*